United States Patent
Shetty et al.

(10) Patent No.: US 11,127,867 B2
(45) Date of Patent: Sep. 21, 2021

(54) MONOCRYSTALLINE GERMANIUM WAFERS, METHOD FOR PREPARING THE SAME, METHOD FOR PREPARING INGOTS AND USE OF MONOCRYSTALLINE WAFERS

(71) Applicant: Beijing Tongmei Xtal Technology Co., Ltd., Beijing (CN)

(72) Inventors: Rajaram Shetty, Fremont, CA (US); Yuanli Wang, Beijing (CN); Yvonne Zhou, Fremont, CA (US); Weiguo Liu, Fremont, CA (US); Sung-Nee George Chu, Fremont, CA (US)

(73) Assignee: Beijing Tongmei Xtal Technology Co., Ltd., Beijing (CN)

( * ) Notice: Subject to any disclaimer, the term of this patent is extended or adjusted under 35 U.S.C. 154(b) by 0 days.

(21) Appl. No.: 16/770,902

(22) PCT Filed: Jul. 9, 2018

(86) PCT No.: PCT/CN2018/094956
§ 371 (c)(1),
(2) Date: Jun. 8, 2020

(87) PCT Pub. No.: WO2019/109636
PCT Pub. Date: Jun. 13, 2019

(65) Prior Publication Data
US 2021/0175377 A1    Jun. 10, 2021

(30) Foreign Application Priority Data
Dec. 8, 2017  (CN) .......................... 201711296746.1

(51) Int. Cl.
*C30B 29/08*  (2006.01)
*H01L 31/0288*  (2006.01)
(Continued)

(52) U.S. Cl.
CPC ........ *H01L 31/0288* (2013.01); *C30B 11/006* (2013.01); *C30B 29/08* (2013.01);
(Continued)

(58) Field of Classification Search
CPC ....... C30B 11/006; C30B 29/08; C30B 33/00; H01L 31/0687; H01L 31/1828
See application file for complete search history.

(56) References Cited

U.S. PATENT DOCUMENTS 6,489,225 B1 * 12/2002 Ross .................. H01L 21/2636
257/E21.333
7,115,246 B2 * 10/2006 Zhao ........................ C01B 6/23
423/658.2
(Continued)

FOREIGN PATENT DOCUMENTS

| CN | 102312279 A | 1/2012 |
|---|---|---|
| CN | 102877121 A | 1/2013 |

(Continued)

OTHER PUBLICATIONS

Chu et al. (1988) "Antiphase domains in GaAs grown by metalorganic chemical vapor deposition on silicon-on-insulator," Journal of Applied Physics 64(6): 2981-2989.
(Continued)

*Primary Examiner* — Robert M Kunemund
(74) *Attorney, Agent, or Firm* — Leydig, Voit & Mayer, Ltd.

(57) ABSTRACT

A monocrystalline germanium wafer that increases the open-circuit voltage of multijunction solar cells, a method for preparing the monocrystalline germanium wafer and a method for preparing an ingot from which the monocrystalline germanium wafer is prepared. The monocrystalline germanium wafer that increases the open-circuit voltage of the bottom cell of multijunction solar cells is prepared by adjusting the amounts of the co-dopants silicon and gallium in the monocrystalline germanium wafer, the ratio of silicon
(Continued)

to gallium in the preparation of the monocrystalline germanium.

18 Claims, 6 Drawing Sheets

(51) Int. Cl.
    *C30B 11/00*     (2006.01)
    *C30B 33/00*     (2006.01)
    *H01L 31/0687*     (2012.01)
    *H01L 31/18*     (2006.01)

(52) U.S. Cl.
    CPC .......... *C30B 33/00* (2013.01); *H01L 31/0687* (2013.01); *H01L 31/1828* (2013.01)

(56) References Cited

U.S. PATENT DOCUMENTS

| | | | |
|---|---|---|---|
| 8,278,656 B2 * | 10/2012 | Mattmann | ............. C30B 29/403 257/43 |
| 8,506,706 B2 | 8/2013 | Liu | |
| 2017/0004969 A1 | 1/2017 | Cohen et al. | |

FOREIGN PATENT DOCUMENTS

| | | |
|---|---|---|
| CN | 103659349 A | 3/2014 |
| CN | 106067493 A | 11/2016 |
| CN | 108091708 A | 5/2018 |
| JP | 2010215455 A | 9/2010 |

OTHER PUBLICATIONS

International Search Report and Written Opinion, dated Oct. 18, 2018, corresponding to International Patent Application No. PCT/CN2018/094956, 8 pp.

European Search Report dated Jun. 30, 2021 for corresponding EP application No. 18 886 548.9, 8 pages.

Schweizer et al. (2001) "Defect density characterization of detached-grown gemanium crystals," Journal of crystal growth, vol. 235, 161-166.

Sentimenti et al. (1993) "Determination of impurities in germanium tetrachloride, germanium dioxide and high-purity germanium by Zeeman-effect electrothermal atomic absorption spectrometry," Journal of analytical atomic spectrometry, 89-92.

\* cited by examiner

MONOCRYSTALLINE GERMANIUM WAFERS, METHOD FOR PREPARING THE SAME, METHOD FOR PREPARING INGOTS AND USE OF MONOCRYSTALLINE WAFERS

CROSS-REFERENCE TO RELATED APPLICATIONS

This application is a U.S. National Stage Application filed under 35 U.S.C. 0.371 of International Application No. PCT/CN2018/094956, filed Jul. 9, 2018, which claims the benefit of Chinese Application No. 201711296746.1, filed Dec. 8, 2017. Both of these applications are hereby incorporated by reference in their entireties.

BACKGROUND

1. Field

The present invention relates to monocrystalline germanium wafers that increase the open-circuit voltage of multijunction solar cells, a method for preparing those monocrystalline germanium wafers and a method for preparing the ingots of monocrystalline germanium from which the wafers that increase the open-circuit voltage of multijunction solar cells are prepared.

2. Description of Related Information

High-efficiency, high-power solar cells have been widely used in space solar systems and large-scale ground-based solar concentrator systems. Monocrystalline germanium is an ideal substrate material for such high-efficiency, high-power multijunction solar cells, and germanium is the substrate material of the bottom cell of such multijunction solar cells. The photoelectric conversion efficiency of germanium-based multijunction solar cells has greatly increased to ~31-32% compared to that of silicon-based single solar cell of ~15-20%. To consistently prepare these high efficiency multijunction solar cells or photovoltaic devices that convert the solar energy into electrical energy, and to further enhance their overall conversion efficiency it is of particular importance to improve the performance of the germanium substrate material, and the photoelectric conversion efficiency of the germanium bottom cell.

In a solar cell, electron-hole pairs, i.e., the photo-generated carriers, are produced upon light illumination. The electrons and holes are separated by the built-in electric field in the PN junction to form a photocurrent. The amount of photocurrent generated under certain lighting conditions determines the quantum efficiency of the solar cell. In addition, if the photo-generated carriers are recombined before a photocurrent is generated, the light-to-electricity conversion efficiency of the cell will be reduced. During epitaxial growth of a monocrystalline material of a III-V group zincblende structure (for example, monocrystalline compound semiconductor materials such as GaAs and InP) on a (100) plane of a diamond structure (for example, on a (100) plane of a silicon or germanium monocrystalline substrate), there is a fundamental problem; that is, anti-phase domains will form at the epitaxial growth interface (see FIG. 1). S. N. G Chu et al. grew a GaAs epitaxial layer on a silicon monocrystalline layer by metal-organic chemical vapor deposition (S. N. G Chu, S. Nakahara, S. J. Pearton, T. Boone, and S. M. Vernon, Journal of Applied Physics, Vol. 64(6) p.p. 2981-2989. It has been found by study that the anti-phase domain boundaries formed in the epitaxial layer and substrate interface are non-radiative recombination centers of photo-generated carriers. Therefore, when III-V compound epitaxial materials were grown on a germanium substrate, under the condition that the distance from the PN junction to the interface is less than the carrier diffusion length, the anti-phase domain boundaries will reduce the quantum efficiency of the germanium solar cell.

Further studies have found that when silicon or similar trace dopant atoms are segregated at anti-phase domain boundaries, the size of the anti-phase domain of the interface will grow at high annealing temperatures. With the increase of the size of the interface anti-phase domain, the anti-phase domain boundary interface will be greatly reduced, thereby greatly reducing the positions of non-radiative recombination of photo-generated carriers and thus increasing the quantum efficiency of light-to-electricity conversion of solar cells. The characteristic parameter used to represent the efficiency of a solar cell device is the open-circuit voltage Voc, and the relationship between the open circuit voltage Voc and the photocurrent $I_{ph}$ is as follows:

$$V_{oc} = \frac{kT}{q}\ln\left(\frac{I_{ph}}{I_s} + 1\right)$$

wherein $-I_s$ represents the saturation current of the PN junction, k represents Planck's constant, T represents temperature, and q represents electron charge.

For solar cells, the light-to-electricity conversion efficiency can be increased to the greatest extent and the maximum power output can be obtained by increasing the open-circuit voltage. Nevertheless, when III-V group epitaxial material is epitaxially grown on a germanium substrate, since anti-phase domains will form in the first epitaxial layer on germanium substrate, the boundaries of the anti-phase domains will become centers for recombination of photo-generated carriers, thereby reducing the light-to-electricity conversion efficiency of the pn-junction of the bottom cell next to the interface and hence the open-circuit voltage of the bottom cell.

SUMMARY OF THE INVENTION

The present invention is proposed to enhance the open-circuit voltage of bottom germanium-cell of multijunction solar cells so as to enhance the light-to-electricity conversion efficiency and power output of the solar cells.

An objective of the present invention is to provide a method to produce monocrystalline germanium wafers that increase the open-circuit voltage of the bottom cell of the multijunction solar cells, the wafers comprising co-dopants silicon and gallium, with silicon having an atomic concentration of $1\times10^{14}$ atoms/cc to $1\times10^{19}$ atoms/cc and gallium having an atomic concentration of $1\times10^{16}$ atoms/cc to $1\times10^{20}$ atoms/cc. Further, the ratio of atomic concentration of silicon to atomic concentration of gallium in the wafer is 1:10-20, and the wafer has a thickness of 100-700 μm, preferably 100-500 μm, more preferably 100-200 μm and even more preferably 120-140 μm.

Another objective of the present invention is to provide a method for preparing a monocrystalline germanium ingot from which the wafers that increase the open-circuit voltage of the bottom cell of multijunction solar cells prepared from the germanium substrate; wherein the co-dopants silicon and gallium are in such amounts that within an effective length of the ingot, silicon has an atomic concentration of from $1 \times 10^{14}$ atoms/cc to $10 \times 10^{18}$ atoms/cc, and gallium has an atomic concentration of from $1 \times 10^{16}$ atoms/cc to $10 \times 10^{19}$ atoms/cc and the ratio of the atomic concentration of silicon to the atomic concentration of gallium is 1:10-20. Further, the monocrystalline germanium ingot has a circular cross-section with any diameter up to 10 inches.

In a preferred embodiment of the method for preparing a monocrystalline germanium ingot that increases the open-circuit voltage of the bottom cell of multijunction solar cells according to the present invention, the resulting monocrystalline germanium ingot has an average dislocation density of less than $80/cm^2$ for the entire ingot from head to tail.

The present invention also provides monocrystalline germanium wafer sliced from the monocrystalline germanium ingot prepared by the method and use of the monocrystalline germanium wafer that increases the open-circuit voltage of the bottom cell of multijunction solar cells prepared by the method described later as per the present invention.

Based on co-doping of Si with Ga according to the present invention, less antiphase domain boundaries in the first epitaxial layer of III-V group material grown on the monocrystalline germanium wafer substrate of the present invention are expected to be formed or even no antiphase domain boundaries are expected to be formed.

The present invention increases the open-circuit voltage Voc of the solar cell device by controlling, reducing and eliminating the recombination positions of the photogenerated carriers for the bottom cell, thereby increasing the light-electricity conversion efficiency of the multijunction cell.

The invention increases the open-circuit voltage of multijunction solar cells by adding a certain amount of the co-dopants to a monocrystalline germanium ingot, and therefore the resulting monocrystalline germanium wafers. The wafer is the substrate and the bottom cell of the multijunction solar cell. The reason for the increase of the open-circuit voltage is the reduction and elimination of the antiphase domain boundaries in the first epitaxial layer of III-V group materials forming the multijunction solar cell on germanium substrate, thereby reducing the nonradiative recombination of photogenerated carriers at the pn-junction next to this interface in the bottom cell.

DETAILED DESCRIPTION OF EXEMPLARY IMPLEMENTATIONS

Figure 1:
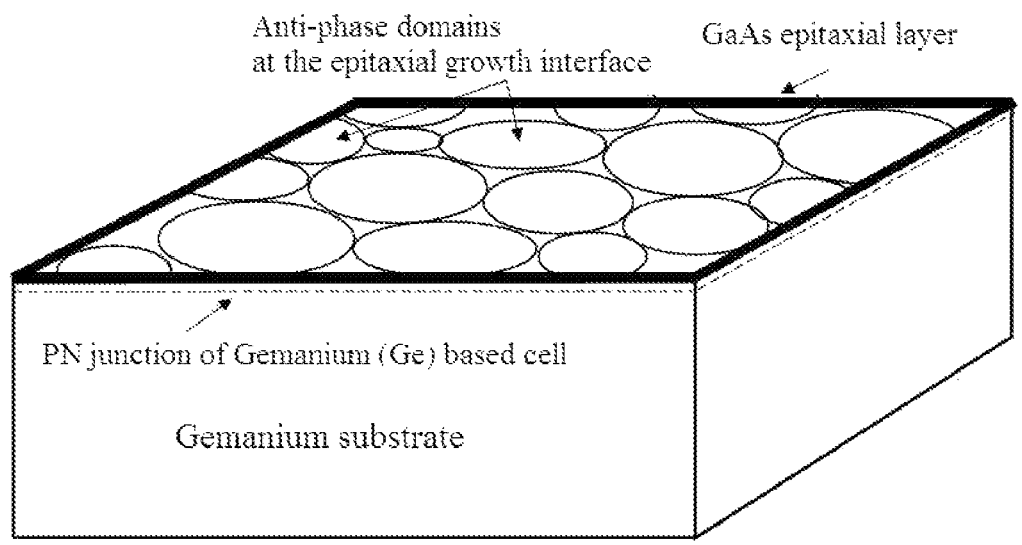
FIG. 1 is a schematic diagram of anti-phase domains formed by III-V compound monocrystalline material epitaxially grown on a monocrystalline germanium (100) substrate.

Reference will now be made in detail to the invention, with drawings to illustrate exemplary implementations. The implementations set forth in the following description do not represent all implementations consistent with the claimed invention. Instead, they are merely some examples consistent with certain aspects related to the invention. In the following description, first we will refer to the wafers and the preparation of these wafers which increase the open-circuit voltage of the bottom cells of the multijunction solar cells, then to the preparation of ingots from which these wafers can be produced, and then to the use of the wafers.

In the present invention, all operations are carried out at room temperature under normal pressure unless otherwise specified.

In the present invention, the diameter of the wafer should be understood as follows: when the wafer is circular, the diameter of the wafer refers to the diameter of a circle; when the wafer is in other shapes (such as an irregular circle, a square and a rectangle), it refers to the diameter of a circle that is centered at the wafer center and includes all portions of the wafer.

In the present invention, the term "effective length" means the actual length of an ingot that can be cut into wafers.

In the present invention, the dopants refer to any elements other than the element germanium, and in particular refer to the elements silicon (Si) and gallium (Ga).

In the present invention, resistivity is measured by the method described in the GB/T 26074-2010 *Monocrystalline Germanium Crystal Resistivity Direct Current Four-Probe Measurement Method*"

Wafers

The present invention provides a monocrystalline germanium wafer that increases the open-circuit voltage of the bottom cell of multijunction solar cells, wherein the monocrystalline germanium wafer comprises co-dopants silicon and gallium, with silicon having an atomic concentration of from $1 \times 10^{14}$ atoms/cc to $10 \times 10^{18}$ atoms/cc and gallium having an atomic concentration of from $1 \times 10^{16}$ atoms/cc to $10 \times 10^{19}$ atoms/cc.

In the monocrystalline germanium wafer according to the present invention, the atomic concentration of silicon is preferably $2 \times 10^{14}$ atoms/cc to $8 \times 10^{18}$ atoms/cc, more preferably $3 \times 10^{14}$ atoms/cc to $7 \times 10^{18}$ atoms/cc; and the atomic concentration of gallium is preferably $2 \times 10^{16}$ atoms/cc to $9 \times 10^{19}$ atoms/cc, and more preferably $2 \times 10^{16}$ atoms/cc to $8 \times 10^{19}$ atoms/cc.

In the present invention, the unit "atoms/cc" means atoms per cubic centimeter.

Alternatively, in the monocrystalline germanium wafer according to the present invention, the atomic concentration of silicon is 1-25 ppm based on the amount of germanium, and the atomic concentration of gallium is 1-100 ppm based on the amount of germanium.

Alternatively, in the monocrystalline germanium wafer of the present invention, the atomic concentration of silicon is preferably 2-20 ppm based on the amount of germanium, and more preferably 3-15 ppm based on the amount of germanium; and the atomic concentration of gallium is preferably 10-80 ppm based on the amount of germanium, and more preferably 20-60 ppm based on the amount of germanium.

In the monocrystalline germanium wafer according to the present invention, the ratio of the atomic concentration of silicon to the atomic concentration of gallium is 1:10-20, preferably 1:8-19, and more preferably 1:6-18.

The monocrystalline germanium wafer of the present invention has a thickness of 100-700 µm, preferably 100-500 µm, more preferably 100-200 µm and even more preferably 120-140 µm.

The monocrystalline germanium wafer of the present invention is cut from a monocrystalline germanium ingot. The monocrystalline germanium ingot is an ingot with a circular transverse cross-section (referred to as a circular ingot). The longitudinal cross-section of the monocrystalline germanium ingot is a rectangle or square. The diameter of the circular cross-section is generally no more than 10 inches, preferably 1-8 inches, more preferably 2-6 inches. Certainly, the monocrystalline germanium ingot may also be an ingot having a transverse cross-section of another shape, for example, a monocrystalline germanium ingot with a square transverse cross-section (square or rectangular) obtained by processing a circular ingot, and non-circular monocrystalline germanium wafers will be obtained by cutting this monocrystalline germanium ingot.

The monocrystalline germanium wafer according to the present invention is preferably cut from the ingot produced by the method for preparing an ingot described later.

Method for Preparing Wafers

The present invention provides a method for preparing monocrystalline germanium wafers, comprising the steps of:
1) Cutting a monocrystalline germanium wafer from a monocrystalline germanium ingot containing the elements silicon and gallium, wherein silicon has an atomic concentration of $1\times10^{14}$ atoms/cc to $10\times10^{18}$ atoms/cc, and gallium has an atomic concentration of $1\times10^{16}$ atoms/cc to $10\times10^{19}$ atoms/cc, and the wafer has an initial thickness of 200-800 µm;
2) The monocrystalline germanium wafer obtained in step 1) is subjected to edge grinding;
3) The monocrystalline germanium wafer edge ground in step 2) is subjected to surface treatment; and
4) After the surface treatment in step 3), the monocrystalline germanium wafer is subjected to rough polishing and then finish polishing to obtain a monocrystalline germanium wafer product, wherein the monocrystalline germanium wafer product obtained has a thickness of 100-700 µm.

The previously mentioned preferred and more preferred technical solutions regarding monocrystalline germanium wafers are also applicable to the method for preparing monocrystalline germanium wafers according to the present invention, and therefore a detailed description thereof will be omitted.

The monocrystalline germanium ingot used in the method for preparing a monocrystalline germanium wafer of the present invention is prepared by the method of preparing an ingot as described later.

In the method for preparing a monocrystalline germanium wafer of the present invention, the cutting in step 1) is performed with a cutting machine such as an OD (Outer Diameter) saw, an ID (Inner Diameter) saw or a multi-wire saw known in the art, for example, the multi-wire cutting machine MWM442DM made by Komatsu of Japan. The multi-wire saw is preferred due to its high productivity and wafer yield. When an ingot is cut using a saw, cutting is performed using a slurry and steel wire that are known in the art. The slurry can be formulated from powdery material and cutting lubricant. The powdery material is known in the art and is commercially available, and may be, for example, diamond powder, boron carbide or silicon carbide powder. In principle, a powdery material with a particle diameter of 5-15 µm used for formulating slurry used for cutting a semiconductor ingot may be used. The particle size of the powdery material is preferably 6-13 µm, and more preferably 8-12 µm. The cutting lubricant is also known in the art and is commercially available, and may be a vegetable oil (e.g. olive oil and soybean oil) or mineral oil. In the present invention, the powdery material is preferably silicon carbide, and the cutting lubricant is preferably mineral oil.

In the method for preparing a monocrystalline germanium wafer according to the present invention, the particle size can be measured by a commercially available particle size analyzer, for example, Malvern Mastersizer®3000 laser diffraction particle size analyzer.

Figure 9:
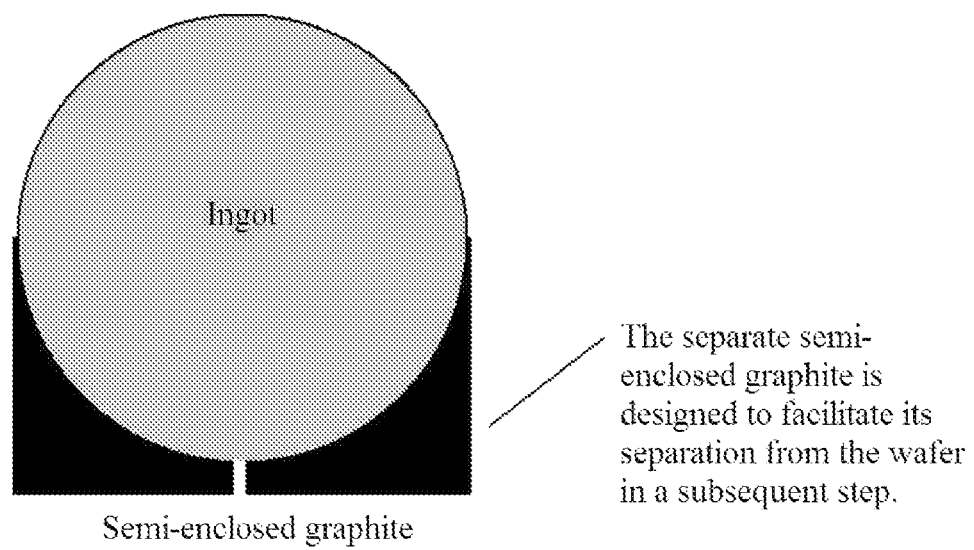
FIG. 9 is a schematic diagram of a semi-enclosed graphite of an ingot fixing device according to the method for preparing the wafer of the present invention.

In the present invention, a monocrystalline germanium ingot can be fixed in order to reduce swaying of the monocrystalline germanium ingot and improve the surface quality. The fixing method is not particularly limited as long as it can effectively prevent the monocrystalline germanium ingot from swaying during the cutting process. The monocrystalline germanium ingot rod is preferably fixed using a fixing device with a semi-enclosed structure to facilitate its separation from the wafer in a subsequent step. The material for preparing the fixing device with a semi-enclosed structure is not particularly limited as long as the materials that will not deform or adversely affect the sliced wafers during cutting can be used; for example, graphite can be used. The preferred fixing device with a semi-enclosed structure of the present invention is semi-enclosed graphite (as shown in FIG. 9).

Figure 10:
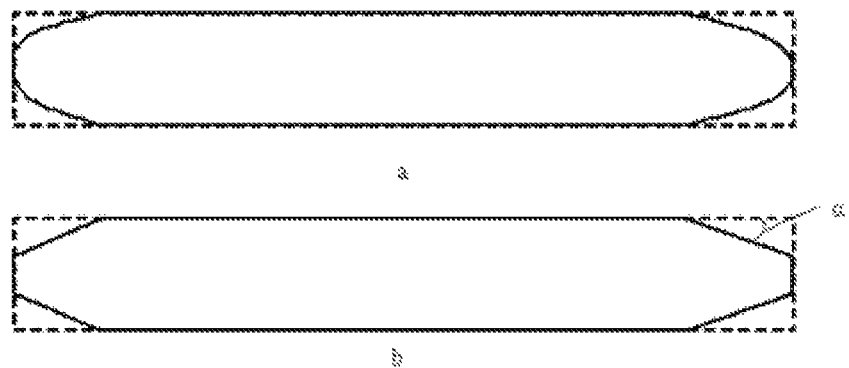
FIG. 10 is a schematic diagram of the chamfering of the wafer according to the method for preparing the wafer according to the present invention, wherein the chamfering in FIG. a is in an arc shape, and the chamfering in FIG. b is in a slope shape.

In the method for preparing a monocrystalline germanium wafer according to the present invention, the monocrystalline germanium wafer is edge ground, that is, the edge of the monocrystalline germanium wafer (as shown in FIG. 10a and FIG. 10b) is chamfered in order to make the edge of the wafer a suitable arc (FIG. 10a) or slope (FIG. 10b, where a is preferably 45±10°). FIGS. 10a and 9b are cross-sectional views of the wafers before and after chamfering. Preferably, the cross-section of the edge of the monocrystalline germanium wafer has an edge with a shape of circular arc (FIG. 10a), whereby the risk of breakage of the monocrystalline germanium wafer in subsequent steps can be reduced or avoided. The chamfering process is usually performed using a chamfering machine, and any chamfering machine known in the art can be used in this step. During chamfering with a chamfering machine, it is preferable to set the feed of the chamfering machine to within 0.4 mm, and preferably within 0.3 mm.

In the method for preparing a monocrystalline germanium wafer according to the present invention, the edge ground monocrystalline germanium wafer is surface-treated, and the surface treatment may be performed by surface grinding the monocrystalline germanium wafer using a grinding machine. B Both sides of the monocrystalline germanium wafer, may be ground if necessary. Grinding process is to eliminate sawing damage on the surface of the monocrystalline germanium wafer from the slicing process and to obtain sufficient wafer flatness to prepare for the subsequent polishing process. The wafer grinding may be performed by any method known in the art, for example, using a grinding apparatus such as the one shown in FIG. 11. The initial monocrystalline germanium wafer is placed in a support pad, with grinding pads on the upper and lower sides (usually being polyester grinding pads), and grinding fluid is used during the grinding process (known polishing liquids can be used). For example, the pressure applied to the wafer during the grinding is about 0.03-0.18 $kg/cm^2$, and preferably 0.05-0.15 $kg/cm^2$, when using an upper and lower disc-type grinding apparatus (the upper and lower grinding discs are rotated in the opposite directions). The speed of the upper disc is 2-12 r/min, and preferably 3-10 r/min, and the speed of the lower disc is 5-20 r/min, and preferably 8-15 r/min. The volume of the grinding liquid is 60-120 $ml/m^2$ grinding disc areas/min (calculated per one side of the equipment disc). The duration of grinding is 20-50 minutes, preferably 25-40 minutes.

In addition, in the method for preparing a monocrystalline germanium wafer according to the present invention, the surface treatment may also be performed by a chemical method. In such case, for example, the monocrystalline germanium wafer may be immersed in the etching liquid or be rinsed with an etching liquid. The etching LIQUID may be a conventional etching liquid used in the art for surface treatment of the monocrystalline germanium wafer.

A grinding machine and a chemical surface treatment method may also be used in combination as necessary. For example, the initial monocrystalline germanium wafer may be first treated with a grinding machine and then treated by a chemical surface treatment method.

In the method for preparing a monocrystalline germanium wafer according to the present invention, the sliced monocrystalline germanium wafer is preferably subjected to chemical surface treatment with an etching liquid alone. The chemical surface treatment is carried out under the following conditions: the temperature is above room temperature, preferably above 30° C., and more preferably above 35° C.; the treatment time is 5-20 seconds, preferably 8-18 seconds and more preferably 10-15 seconds. Preferably, the etching liquid is an aqueous solution comprising ammonia and hydrogen peroxide. The etching liquid comprises 0.1-5 mol % ammonia, 5-15 mol % hydrogen peroxide and the balance water. Under the above conditions, the surface of the wafer after treatment is free of marks of chemicals.

In the method for preparing a monocrystalline germanium wafer according to the present invention, the method further comprises rough polishing and then finish polishing of the surface-treated monocrystalline germanium wafer.

Regarding rough polishing, i.e. mechanochemical polishing, in addition to water, the solutions for rough polishing include sodium dichloroisocyanurates, sulfonates, sodium pyrophosphates, bicarbonates and silica sols. In a preferred embodiment of the present invention, in addition to water, the contents of components in the rough polishing solution are in their weight percentages (based on the total amount of the components except water), and the components include 8.0-22.0% of sodium dichloroisocyanurate, 0.01-0.30% of sulfonate, 4.5-19.0% of sodium pyrophosphate, 3.0-13.0% of bicarbonate and 55.0-72.0% of silica sol, with the total content of the components being 100%. The total weight percentage of the above components dissolved in water is limited so as to not exert any adverse effect on the wafer, and they may be at any concentration, but preferably at a concentration not higher than 6.0%.

Regarding rough polishing, the wafer is subjected to a pressure of 0.04-0.15 $kg/cm^2$, preferably 0.05-0.12 $kg/cm^2$ during the polishing process using the upper and lower disc-type polishing apparatus (the upper and lower discs are reversely rotated). The speed of the upper disc is 10-45 r/min, preferably 12-35 r/min; the speed of the lower disc is 5-40 r/min, preferably 8-30 r/min. The flow rate of the polishing fluid is 60-120 $L/cm^2$ wafer areas/hour. The polishing time is 20-70 minutes, preferably 25-60 minutes.

Regarding finish polishing, i.e., mechanochemical polishing, in addition to water, the finish polishing solution used comprises sodium dichloroisocyanurates, sulfonates, acid sodium pyrophosphates, bicarbonates and carbonates. In a preferred embodiment of the invention, in addition to water, the finish polishing solution comprises, by weight percentages (based on the total amount of the components except water) 29.00-40.00% of sodium dichloroisocyanurate, 0.20-0.45% of sulfonate, 18.00-35.00% of acid pyrophosphate, 17.00-24.00% of bicarbonate and 15.00-23.00% of carbonate. The sum of the components is 100%. The total weight percentage of the above components dissolved in water is limited so as not to exert any adverse effect on the wafer, and the components may be at any concentration, but preferably at a concentration no higher than 3.0%.

Regarding finish polishing, the wafer is subjected to a pressure of 0.05-0.15 $kg/cm^2$, preferably 0.06-0.12 $kg/cm^2$ during the polishing process using an upper and lower disc-type polishing apparatus (the upper and lower discs are reversely rotated). The speed of the upper disc is 20-60 r/min, preferably 25-50 r/min; and the speed of the lower disc is 10-35 r/min, preferably 12-25 r/min. The flow rate of the polishing fluid is 0.5-1.0 $ml/cm^2$ wafer areas/hour. The polishing time is 3-20 minutes, preferably 5-15 minutes.

Among the polishing solutions of the present invention, one of the water-soluble salts of sodium dichloroisocyanurates, (acid) sodium pyrophosphates, bicarbonates and carbonates can be used. Preference is given to one of the water-soluble alkali metal salts or ammonium salts of sodium dichloroisocyanurate, (acid) sodium pyrophosphate, bicarbonate and carbonate, and particular preference is given to sodium salt or ammonium salt thereof.

Regarding the silica sol, conventional silica sols can be used, for example commercially available silica sols or silica sols prepared using the methods in the prior art.

Regarding sulfonates, water-soluble sulfonates, preferably one of the water-soluble alkali metal salts or ammonium salts, and particularly preferably sodium salts or ammonium salts can be used. Preferably, the sulfonate is, for example, a monosulfonate or a disulfonate of $C_{6-16}$ aryl (i.e., aryl containing 6-16 carbon atoms, including substituted aryl) (e.g., $C_{4-10}$ alkyl-benzenesulfonate, benzenesulfonate, naphthalene sulfonate, anthracene sulfonate, $C_{4-10}$ alkyl-benzenedisulfonic acid di-salt, phenyldisulfonic acid di-salt, naphthyldisulfonic acid di-salt or anthryldisulfonic acid di-salt, such as 1,2-benzenedisulfonic acid di-salt, 1,3-benzenedisulfonic acid di-salt, benzenesulfonate or naphthalenesulfonate), one of an alkyl sulfonate (preferably sulfonates with alkyl containing 4-10 carbon atoms, such as a butane butanyl sulfonate, pentane sulfonate, hexane sulfonate, heptane sulfonate, octane sulfonate, nonane sulfonate and decane sulfonate) and a sulfocarbolate, and more preferably a 1,3-benzene disulfonate, benzenesulfonate, naphthalenesulfonate or hexane sulfonate.

Since rough polishing and finish polishing can be performed by the methods in the prior art, a detailed description thereof will be omitted. In the present invention, single-side polishing is preferably performed.

After rough polishing and finish polishing, the surface roughness of the monocrystalline germanium wafer is not higher than 0.5 nm, and the flatness is 3-7 μm, preferably 3-5 μm.

After rough polishing and finish polishing, the surface roughness and the flatness of the monocrystalline germanium wafer can meet the use requirements in the art.

Optionally, the method for preparing a monocrystalline germanium wafer according to the present invention further comprises performing surface cleaning of the finish-polished monocrystalline germanium wafer.

Wet surface cleaning treatment is preferably performed. The cleaning process is not particularly limited as long as it can achieve the desired degree of cleaning of the wafer surface. As to the wet cleaning treatment, according to the prepared monocrystalline germanium wafer, the prior art methods can be applied.

Preferably, the wet surface cleaning is performed in a cleanroom of no less than Class 1,000. The cleanroom rating is defined in USA Federal Standard 209D cleanroom specifications (see Table 1 below). In this case, only the number of dust particles is usually considered. For example, a class 1,000 cleanroom generally means that the number of particles ≥0.5 μm is ≤1000 per cubic foot; and the number of particles ≥5.0 μm is ≤10 per cubic foot. Preferably, after the surface cleaning treatment in step 4), the surface of the wafer is ascertained to be free of particles and free of white mist by visual inspection under light irradiation. And the residual amounts of metal Zn and Cu on the surface of the wafer are respectively ≤10×10$^{10}$ atoms/cm$^2$. In this way, the monocrystalline germanium wafer produced by the method of the present invention does not need any further pre-epitaxial treatment and can reach the ready-to-use level. Since the prior art method can be adopted for cleaning, no further details are provided herein.

Method for Preparing an Ingot

Figure 2:
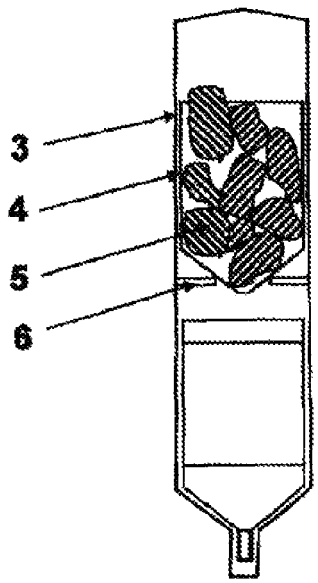
FIG. 2 is a front view of a sealed container for growing a germanium single crystal.
Figure 3:
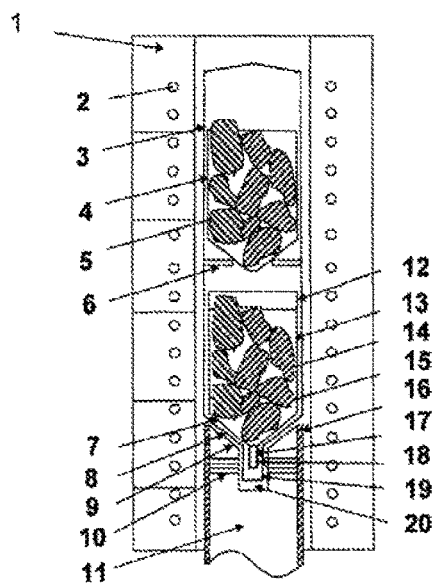
FIG. 3 is a sectional view of an apparatus for growing a crystal containing the sealed container.
Figure 4:
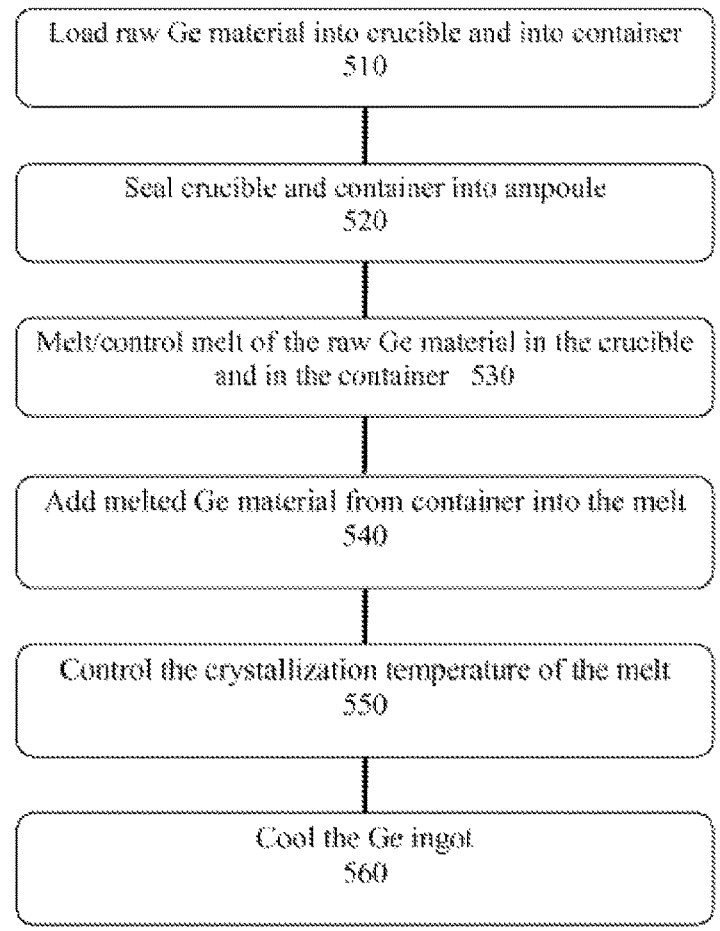
FIG. 4 is a flow chart of the whole process of growing a monocrystalline germanium ingot from raw germanium material using the sealed container shown in FIG. 2 and the apparatus for growing a single crystal.
Figure 5:
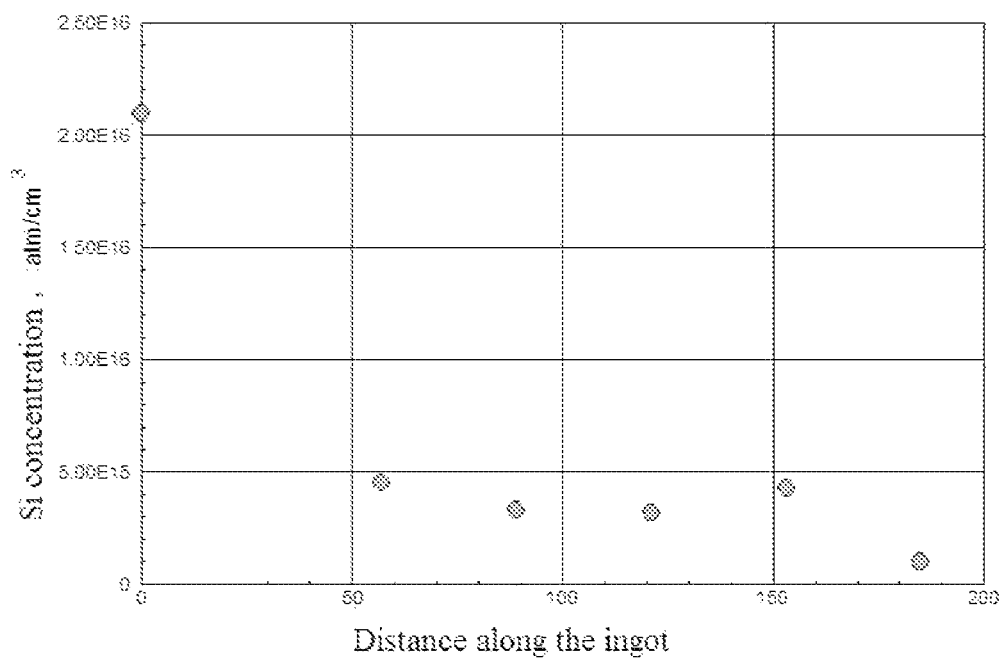
FIG. 5 is a graph showing the Si distribution from the head to the tail of the monocrystalline germanium ingot grown by the method of the present invention.

Further, the present invention provides a method for preparing a monocrystalline germanium ingot for producing monocrystalline germanium wafers that increase the open-circuit voltage of the bottom cell of multijunction solar cells, comprising 1) loading a first raw germanium material, co-dopants silicon and gallium, and optionally a liquid sealer into a crucible comprising a seed well holding a seed crystal (as shown in FIG. 2);
2) loading a second raw germanium material into a loading container (as shown in FIG. 2) for supplementing the first raw germanium material;
3) placing the crucible described in step 1) and the loading container described in step 2) in a quartz tube and sealing the quartz tube under vacuum;
4) placing the quartz tube with the crucible and the loading container described in step 3) into a crystal growth furnace having a movable quartz tube support that supports said quartz tube (as shown in FIG. 3);
5) melting the first raw germanium material to create a first melt, melting the second raw germanium material to create a second melt and allowing all of the melted second raw Ge material in the loading container to flow into the crucible;
6) cooling the melt in the crucible obtained in step 5) and controlling a temperature gradient and cooling rate of the melt so that the melt crystallizes starting from the seed crystal and forms a monocrystalline germanium ingot; and
7) cooling the monocrystalline germanium ingot;

wherein the co-dopants silicon and gallium added in step 1) are in such amounts that within an effective length of the monocrystalline germanium ingot, silicon has an atomic concentration of from $1\times10^{14}$ atoms/cc to $10\times10^{18}$ atoms/cc, and gallium has an atomic concentration of from $1\times10^{16}$ atoms/cc to $10\times10^{19}$ atoms/cc.

In the method for preparing a monocrystalline germanium ingot according to the present invention, within an effective length of the monocrystalline germanium ingot, silicon has an atomic concentration of from $2\times10^{14}$ atoms/cc to $8\times10^{18}$

TABLE 1

USA Federal Standard 209D cleanroom specifications

| Clean room class | Particle size (μm) | Number (Particles/ft3) | Pressure mmHg | Value range °C. | Recommended value °C. | Error value °C. | Max % | Min % | Error % | Wind velocity and ventilation rate (time/hr) | Illumination |
|---|---|---|---|---|---|---|---|---|---|---|---|
| | Dust particle | | | | Temperature | | | | | | |
| 1 | ≥0.5 | ≤1 | >1.3 | 19.4~25 | 22.2 | ±2.8 | 45 | 30 | ±10 | Laminar flow manner | 1080~1620 |
| | ≥5.0 | 0 | | | | Special need | | | Special need | | |
| 10 | ≥0.5 | ≤10 | | | | ±1.4 | | | ±5 | 0.35~0.55 m/s | |
| | ≥5.0 | 0 | | | | | | | | | |
| 100 | ≥0.5 | ≤100 | | | | | | | | | |
| | ≥5.0 | ≤1 | | | | | | | | | |
| 1000 | ≥0.5 | ≤1000 | | | | | | | | Turbulent flow manner | |
| | ≥5.0 | ≤10 | | | | | | | | | |
| 10000 | ≥0.5 | ≤10000 | | | | | | | | ≥20 times/hr | |
| | ≥5.0 | ≤65 | | | | | | | | | |
| 100000 | ≥0.5 | ≤100000 | | | | | | | | | |
| | ≥5.0 | ≤700 | | | | | | | | | | atoms/cc, more preferably from $3\times10^{14}$ atoms/cc to $7\times10^{18}$ atoms/cc and gallium has an atomic concentration of from $2\times10^{16}$ atoms/cc to $9\times10^{19}$ atoms/cc, more preferably $2\times10^{16}$ atoms/cc to $8\times10^{19}$ atoms/cc.

Alternatively, in the method for preparing a monocrystalline germanium ingot according to the present invention, within an effective length of the monocrystalline germanium ingot, the atomic concentration of silicon is 1-25 ppm based on the amount of germanium, and the atomic concentration of gallium is 1-100 ppm based on the amount of germanium.

Alternatively, in the method for preparing a monocrystalline germanium ingot according to the present invention, within an effective length of the monocrystalline germanium ingot, the atomic concentration of silicon is preferably 2-20 ppm based on the amount of germanium, and more preferably 3-15 ppm based on the amount of germanium; and the atomic concentration of gallium is preferably 10-80 ppm based on the amount of germanium, and more preferably 20-60 ppm based on the amount of germanium.

In the method for preparing a monocrystalline germanium ingot according to the present invention, the ratio of the atomic concentration of silicon to the atomic concentration of gallium is 1:10-20, preferably 1:8-19, and more preferably 1:6-18.

High purity germanium raw material is used in the method for preparing an ingot according to the present invention. In the present invention, the term "high-purity germanium" refers to germanium having a resistivity of more than 50 Ω·cm and a purity of 99.999% or more. High-purity germanium raw material with a small amount of dopant ensures the controllability and reproduction of the desired properties and performance of germanium wafers, thus ensuring the stability of solar cell devices prepared from germanium substrates. High-purity raw germanium material is commercially available, and the commercially available high-purity raw germanium material is typically in the form of chunks or powder. In the present invention, high-purity raw germanium material in the form of chunks is preferably used.

In the method for preparing a monocrystalline germanium ingot according to the present invention, the co-dopants silicon and gallium should meet the following requirements:
i) the amount of the co-dopants silicon and gallium is such that within an effective length of the resulting monocrystalline germanium ingot, silicon has an atomic concentration of from $1\times10^{14}$ atoms/cc to $10\times10^{18}$ atoms/cc, and gallium has an atomic concentration of from $1\times10^{16}$ atoms/cc to $10\times10^{19}$ atoms/cc. Preferably, within an effective length of the monocrystalline germanium ingot, silicon has an atomic concentration of from $2\times10^{14}$ atoms/cc to $8\times10^{18}$ atoms/cc, more preferably from $3\times10^{14}$ atoms/cc to $7\times10^{18}$ atoms/cc, and gallium has an atomic concentration of from $2\times10^{16}$ atoms/cc to $9\times10^{19}$ atoms/cc, more preferably $2\times10^{16}$ atoms/cc to $8\times10^{19}$ atoms/cc.
ii) The co-dopants silicon and gallium are placed in a crucible (as shown in FIG. 3)

Thus, the co-dopants silicon and gallium are in an active state in the resulting monocrystalline germanium ingot and the contents of the silicon and gallium can reach the desired level, thereby ensuring increase of the open-circuit voltage of the bottom cell of multijunction solar cells.

The container in which the monocrystalline germanium ingot grows can be made of a suitable crucible material such as a pyrolytic boron nitride (PBN) crucible, which, as a relatively stable material, neither contaminates the raw germanium material nor reacts with the germanium melt at a temperature 100° C. higher than the melting point of germanium of about 938° C. The container or crucible in which a monocrystalline germanium ingot grows includes a body portion that may be cylindrical having a diameter slightly larger than the diameter of the monocrystalline germanium ingot to be prepared, a small diameter seed well at the bottom, and a conical transition region between the bottom seed well and the cylindrical main body (as shown in FIG. 2). The seed well is used for holding a cylindrical seed crystal prepared from high-purity germanium single crystals.

The crystal orientation of the upper end face of the seed crystal is the surface crystal orientation of the desired monocrystalline germanium substrate such as (100) crystal orientation or a surface orientation deflected by a certain angle to the adjacent crystal orientation axis relative to the (100) crystal orientation. Polycrystalline germanium chunks in suitable shapes are loaded into the growth crucible above the seed cavity.

In the present invention, monocrystalline germanium ingots are grown by a vertical gradient freeze melt growth technique. The apparatus for growing a monocrystalline germanium crystal, with which the method for preparing monocrystalline germanium ingots according to the present invention is performed, is described in U.S. Pat. No. 8,506,706B2. The full text of the description of the aforementioned document is incorporated herein by reference.

FIG. 3 illustrates a cross sectional view of an example of an apparatus for growing a germanium crystal. The apparatus may include a furnace typically used in a vertical gradient freeze (VGF) growing process, and may include a quartz tube support 11 in a furnace 1, wherein the heater 2 is made up of multiple zones, each controlled individually by a computer controlled control system. The temperature of each zone is adjusted to give the desired overall temperature profile and the temperature gradient for controlled solidification of the melt. The temperature profile and the temperature gradient in the furnace are adjusted such that the crystallization interface moves predictably up through the melt, for example, creating a temperature gradient of 0.3 to 2.5° C./cm, preferably 0.5 to 2.0° C./cm and more preferably 1.0 to 1.5° C./cm in the ingot growth zone; and creating a lower temperature gradient of 0.2 to 1.5° C./cm, preferably 0.2 to 1.0° C./cm and more preferably 0.2 to 0.5° C./cm at the seed crystal end. The quartz tube support 11 provides physical support and thermal gradient control for a quartz tube 3 which contains a crucible 12 (growth crucible), which in turn is capable of holding a seed in a seed well 18. The quartz tube support 11, when the furnace is in operation, can be moved axially during the crystal growth process. The crucible 12 may contain a seed crystal 17 from which is grown a monocrystal formed on top of the seed crystal. In one implementation, the crucible 12 may be a pyrolytic boron nitride (pBN) structure with a cylindrical crystal growth portion 13, a smaller diameter seed well cylinder 18 and a tapered transition portion 7. The crystal growth portion 13 is open at the top of the crucible 12 and has a diameter equal to the desired diameter of the crystal product. In an illustrative implementation, at the bottom of the crucible 12, the seed well cylinder 18 may have a closed bottom and a diameter slightly larger than that of a high quality seed crystal 17, e.g., about 6-25 mm, and a length on the order of 30-100 mm. The cylindrical crystal growth portion 13 and the seed well cylinder 18 may have straight walls or may taper outwardly on the order of one to 30 degrees to facilitate the removal of the crystal from the crucible 12. The tapered transition portion 7 between the growth portion 13 and the seed well cylinder 18 has an angled side wall pitched at, for example approximately 45-60 degrees, with a larger diameter equal to and connected to the growth zone wall and a narrower diameter equal to and connected to the seed well wall. The angled side wall may also be at other angles that are steeper or less steep than 45-60 degrees.

The quartz tube 3 has a shape similar to that of the crucible 12. The quartz tube 3 is cylindrical in a seed growth region 19, cylindrical with a narrower diameter in its seed well region 19 and has a tapered transition region 8 between the two regions. The crucible 12 fits inside the quartz tube 3 with a narrow margin between them. An upper loading container 4, as a loading container (feeding crucible), is seated on a quartz support 6. The quartz support 6 is sealed in the middle part of the quartz tube 3. In one implementation of the invention, this feeding crucible 4 is made of pBN. During the heating process, the raw germanium material is melted and dropped down into the crucible 12 from the bottom hole of the feeding crucible 4. The quartz tube 3 is closed at the bottom of its seed well region 19 and sealed on top after the crucible and raw materials are loaded.

Since the quartz tube-crucible combination has a funnel shape, the quartz tube support 11 is required to accommodate this funnel shape and hold the quartz tube 12 stable and upright inside the furnace 1. In other implementations, the quartz tube-crucible combination may be in a different shape, and the basic structure of the quartz tube support 11 would be changed accordingly to fit the different shape. According to an implementation, the stability of, and the supporting strength provided to the quartz tube and its contents are provided through a solid, thin-walled cylinder 16 of the quartz tube support 11. The solid, thin-walled cylinder 16 accommodates the funnel end of the quartz tube structure 3. In one implementation, the crucible support cylinder 16 is made of a heat transmitting material, preferably quartz. In other implementations, silicon carbide or a ceramic may also be utilized to form the crucible support cylinder 16.

A low density insulating material, such as ceramic fiber, may fill the majority of the inside of the support cylinder 11 with only a hollow axial core 20 in approximately the center of the insulating material left empty (filled with no insulating material) to receive the seed well 19 of the quartz tube 3.

The low-density insulating material may also comprise alumina fiber (1,800° C.), alumina-silica fiber (rated for 1,426° C.), and/or zirconia fiber (rated for 2,200° C.). The insulating material is carefully placed in the quartz tube support 11. The weight of the quartz tube 3, as it sits on top of the cylinder 16, pushes the insulating material down and forms the slanted insulating material edge 9. Filling the majority of the cylinder interior with a low-density insulator reduces the flow of air, which ensures that little or no undesirable, relatively uncontrollable convection flow will take place. Such convection is an uncontrollable heat transfer mode that works to the detriment of the VGF and other crystal growth process.

The hollow core 20, with a diameter approximately equal to the quartz tube seed well 19, extends downward to a small distance below the bottom of the quartz tube seed well 19. In another implementation, the hollow core 20 extends through the crucible support from the bottom of the seed well to the bottom of the furnace apparatus 1. The hollow core 20 provides a cooling path from the center of the crystal. It contributes to cooling in the seed well and in the center of the growing crystal. With this construction, heat energy can escape down through the center of the solid crystal and seed, down through this hollow core 20 in the insulating material within the crystal support 11. Without the hollow core 20, the temperature of the center of the cooling ingot would naturally be higher than that of the crystal material nearer to the outer surface. In this case, the center of the ingot in any horizontal cross section would crystallize later after its perimeter had solidified. Crystals with uniform electrical properties cannot be made under these conditions. With the creation of a hollow core 20 included in the crystal support method, heat energy is conducted down through the bottom of the quartz tube 3 and the hollow core 20 from where it radiates back out of radiation channels 10. It is important to reduce heat energy from the center of the growing crystal so that the isothermal layers are kept flat across the crystal diameter. Maintaining a flat crystal-melt interface allows the production of crystals with uniform electrical and physical properties.

The low-density insulating material within the cylinder 11 obstructs the flow of heat radiation from a set of furnace heat elements 2 to the quartz tube 3 in the seed well region 19; thus, this method requires the creation of a plurality of horizontal radiation channels/openings/tunnels 10 through the insulation material. The radiation channels 10 penetrate the insulating material to provide heat radiation outlets to controllably transfer heat from the furnace heating elements 2 to the quartz tube seed well 19. The number, shapes and diameters of the radiation channels 10 vary depending on specific conditions. The radiation channels may also be slanted, bent or wave-like. The radiation channels do not necessarily have to be continuous, as they may extend only partially through the insulating material. This helps minimize convection currents. In one implementation, the diameter of these channels is small, on the order of a pencil width, so that convection airflow is insignificant.

According to other implementations of the invention, larger holes with cross-sectional area on the order of 6.4516 $cm^2$ (a square inch) or more can also be used. The radiation channels 10 through the insulating material also work in conjunction with the hollow core 20 in the center of the insulating material to radiate heat energy drawn from the center of the crystal, and cool the crystal with planar isothermal temperature gradient layers. The radiation channels 10 enable temperature control and directly relate to crystal growth yield.

In one exemplary implementation of the innovations herein, in the phase of monocrystalline germanium ingot growing, the furnace temperature may be decreased at a rate of about 0.2 to about 0.5° C./hour to allow the monocrystalline germanium ingot to grow.

FIG. 3 illustrates an exemplary process of melting and supplying germanium. FIG. 3 illustrates an initial state, where the solid germanium is present in both the loading container 4 and the crucible 12. As innovative heating features and processes, an intermediate state of the germanium melt is shown in FIG. 2, which illustrates a state wherein the solid germanium has been melted to a liquid in the crucible 12.

The heating elements of the heating zones of the furnace are adjusted in association with the respective supply of power so that the upper container is provided with required heat energy. Specifically, the upper container may be heated such that the germanium in the upper container 3 begins melting, and the molten germanium flows into the crucible 12 via a hole at the bottom of container 3. In one exemplary implementation, the region of the furnace where the upper container is present is heated to the range of about 940 to about 955° C. This process continues until all of the germanium in the loading container flows into the crucible 12.

The furnace 1 as shown in FIG. 3 is an example of a furnace that may be used for a Vertical Gradient Freeze (VGF) crystal growth process. Other furnaces and configurations, such as Vertical Bridgman, may also be used. In the VGF crystal growth process, the crystallizing temperature gradient within a fixed heat source is being moved electrically while the crystal is stationary.

To carry out vertical gradient freeze growth (VGF), it is necessary to establish an appropriate temperature gradient profile in the furnace. The heating zones of the furnace are controlled separately and individually with regard to their respective power supplies via a computer that is programmed to heat and cool to fulfill the furnace crystallizing temperature and temperature gradient requirements. With regard to the growing of germanium ingots, for example, the furnace temperature fluctuation may be required to be within about ±0.1° C. During the preparation of the furnace, the raw germanium polycrystalline material is loaded into the quartz tube 3 as described.

As shown in the figures, a pBN loading container 4 which has a hole in the tapered portion is seated on a support 6 which is made of quartz located above crucible 12 in the quartz tube 3. The loading container 4 allows the crucible 12 to be loaded with more raw materials. In particular, the raw germanium material 5 is typically solid chunks or pieces and therefore cannot be tightly packed into the crucible 12 to be melted. Thus, the loading container is used to hold extra raw material that can be melted and then drain down into the crucible 12 which results in a larger germanium charge in the crucible 12 which in turn results in a larger length and diameter germanium crystal.

In one exemplary implementation, an off-oriented (100) seed may be loaded into the crucible of about 100 mm diameter before the charge material is loaded. The charge of raw germanium material and appropriate amounts of the dopants silicon and gallium may be loaded into the crucible and into the loading container which are placed into the quartz tube 3 which is then allowed to access to a vacuum pump system. The quartz tube and contents are evacuated to a vacuum of about $2.00 \times 10^{-4}$ Pascal (about $1.5 \times 10^{-6}$ Torr), after which the quartz tube is sealed and loaded into the furnace, as shown in FIG. 3. The furnace is started, and the quartz tube and contents are heated. The heating rate may be 5 to 40° C./min, preferably 10 to 30° C./min and more preferably 15 to 20° C./min and the final heating temperature of approximately 1000° C.±50° C. (the melting point of germanium is about 940° C.). The crystallization interface temperature gradient may be adjusted to be 0.4 to 12° C./cm by adjusting the heat input to the different zones of the furnace. Further, the overall temperature profile may be adjusted to give a crystallization rate of about 1-2 mm/hr. After the solidification is completed, the furnace may be cooled down at about 15-40° C./hr.

Monocrystalline germanium ingots produced using the above-mentioned exemplary growth process have very low defect density along their entire length and the defects are uniformly distributed. The head and tail wafers of a grown crystal are sliced to etch the dislocation densities. The head and tail wafers have uniform dislocation densities. The head wafer may have an average dislocation density of less than 80/cm², which may be 78/cm², or 75/cm², or 70/cm², or 65/cm². The tail wafer may have an average dislocation density of less than 75/cm², which may be 70/cm², or 65/cm², or 66/cm², or 65/cm² or in other such numerical windows in ranges of 10%, 20% or 30% of the quantities measured or set forth herein. Using the process of the present invention, the defect densities reduce by 15-20%.

The reduction of the defect density is attributed to the solid-solution strengthening effect brought about by the co-dopants added during the crystal growing.

In the present invention, the dislocation density is measured by the method described in GB/T5252-2006 *Germanium Single Dislocation Etch Pit Density Measurement Methods*.

In another example, the inventive apparatus is composed of a quartz tube into which both the pBN loading container and the crucible may be inserted, along with a support 6 to hold the pBN loading container. The crucible may have a diameter of about 150 mm in the growing crystal section, a length of 160 mm in the growing crystal section, and a diameter of about 7 mm in the seed crystal section. In one exemplary implementation, a (100) oriented Ge seed crystal was inserted in the seed well of the pBN crucible and boron trioxide as the liquid sealant was put into the pBN crucible above the seed. Then, Ge polycrystalline material and dopants silicon and gallium were loaded into a pBN growth crucible and a pBN feeding container respectively and both the pBN growing container and PBN feeding crucible were inserted in a quartz tube and the quartz tube under a reduced pressure of about $2.00 \times 10^{-4}$ Pascal ($1.5 \times 10^{-6}$ Torr) was sealed with a quartz cap. The sealed quartz tube then was loaded in the furnace and placed on the quartz tube support.

The above-described quartz ampoule was heated at the rate of approximately 270° C./hr. When temperature was about 30° C. over the melting point of the crystallizing material, the heating was maintained until all of the material was melted. The heating rate may be 5 to 40° C./min, preferably 10 to 30° C./min and more preferably 15 to 20° C./min and the heating temperature of approximately 1000° C.±50° C. (the melting point of germanium is about 940° C.). The crystallization interface temperature gradient may be adjusted to be 0.2 to 10° C./cm by adjusting the heat input to the different zones of the furnace. Further, the overall temperature profile may be adjusted to give a crystallization rate of about 1-2 mm/hr. After the solidification is completed, the furnace may be cooled down at about 20-40° C./hr. to produce the monocrystalline germanium ingot.

The present invention needs to satisfy the following conditions during the single crystal growing process:

a) the raw material from which monocrystalline germanium crystals is to be grown is co-doped with the appropriate amounts of dopants such as silicon and gallium;

b) the dopants are added during the process of loading raw germanium material, and then single crystal growth is carried out; and c) during the single crystal growing process, a suitable single crystal growth rate and temperature gradient need to be maintained so as to avoid the formation of poly-crystals that can be caused by co-doping of dopants such as silicon and gallium during the growing process.

The above conditions that are distinct from a standard monocrystalline germanium crystal growth process with or without just one dopant such as gallium are essential in order to maintain a proper solid-liquid interface shape during single crystal growth and prevent new grains or polymorphic nuclei from forming and growing, so as to grow an intact monocrystalline germanium ingot that can yield monocrystalline germanium substrates that increase the open-circuit voltage of multijunction solar cells. Polycrystalline growth may occur near the seed crystal, or in the cone-shaped transition zone from the seed crystal to the cylindrical crystal, or in the growth process of the cylindrical crystal. The appearance of polycrystallinity will result in the entire ingot or a portion of the ingot becoming unsuitable for preparing monocrystalline germanium substrates for multi-junction solar cells.

The ingot prepared by the method for preparing an ingot according to the present invention comprises silicon and gallium whose atomic concentrations vary in the axial direction of the ingot, wherein at an effective length of the ingot, silicon has an atomic concentration of from $1\times10^{14}$ atoms/cc to $10\times10^{18}$ atoms/cc, and gallium has an atomic concentration of from $1\times10^{16}$ atoms/cc to $10\times10^{19}$ atoms/cc; silicon has a preferred atomic concentration of from $2\times10^{14}$ atoms/cc to $8\times10^{18}$ atoms/cc, and a more preferred atomic concentration of from $3\times10^{14}$ atoms/cc to $7\times10^{18}$ atoms/cc; and gallium has a preferred atomic concentration of from $2\times10^{16}$ atoms/cc to $9\times10^{19}$ atoms/cc and a more preferred atomic concentration of from $2\times10^{16}$ atoms/cc to $8\times10^{19}$ atoms/cc.

From the seed crystal end to the end of the single crystal growth (or the entire melt solidifies and grows into a solid-state single crystal), the designed growth procedure enables a suitable growth rate and a suitable temperature gradient near the solid-liquid interface. Compared with the growth of monocrystalline ingots without dopants or with just one dopant, the growth of monocrystalline germanium ingots containing co-dopants such as gallium and silicon requires a growth rate ~20% lower as illustrated in example described below. Thus the rate at which the solid-liquid interface moves and the rate at which the temperature decreases at different temperature zones is reduced by about 20%.

In the case of this growth procedure and the addition of an appropriate amount of dopant, single crystal growth is maintained over the entire length of the ingot. For example, a monocrystalline germanium ingot with a diameter of 4 inches and a length of about 200 mm can be grown as shown in the example.

After all of the raw materials in the crucible have solidified, the growing ingot is cooled to room temperature under controlled temperature conditions, with a cooling rate of 20-40° C./h in the described example.

Use

The present invention also relates to use of the monocrystalline germanium wafer according to the present invention for increasing open-circuit voltage of multijunction solar cells.

In a preferred embodiment of the use according to the present invention, the open-circuit voltage of a multijunction solar cell using the monocrystalline germanium wafer of the present invention is increased by 0.2-2.2% (corresponding to an increase of 5-60 mV), preferably by 0.8-2.0% (corresponding to an increase of 21-54 mV), and more preferably 1.0-1.5% (corresponding to an increase of 27-40 mV).

Based on co-doping of Si with Ga according to the present invention, less antiphase domain boundaries in the first III-V epitaxial layer on the monocrystalline germanium wafer substrate of the present invention are expected to be formed.

The present invention increases the open-circuit voltage Voc of the solar cell device by controlling, reducing and eliminating the recombination position of the photogenerated carriers in Ge bottom cell.

The present invention relates to the following schemes:
Scheme 1: A monocrystalline germanium wafer that increases the open-circuit voltage of the bottom cell of multijunction solar cells, wherein the monocrystalline germanium wafer comprises co-dopants silicon and gallium, with silicon having an atomic concentration of from $1\times10^{14}$ atoms/cc to $10\times10^{18}$ atoms/cc and gallium having an atomic concentration of from $1\times10^{16}$ atoms/cc to $10\times10^{19}$ atoms/cc; preferably, silicon having an atomic concentration of from $2\times10^{14}$ atoms/cc to $8\times10^{18}$ atoms/cc, and gallium having an atomic concentration of from $2\times10^{16}$ atoms/cc to $9\times10^{19}$ atoms/cc; and more preferably, silicon having an atomic concentration of from $3\times10^{14}$ atoms/cc to $7\times10^{18}$ atoms/cc, and gallium having an atomic concentration of from $2\times10^{16}$ atoms/cc to $8\times10^{19}$ atoms/cc.

Scheme 2: The monocrystalline germanium wafer that increases the open-circuit voltage of multijunction solar cells according to scheme 1, wherein ratios of an atomic concentration of silicon to that of gallium are 1:10-20, preferably, 1:8-19 and more preferably 1:6-18.

Scheme 3: The monocrystalline germanium wafer that increases the open-circuit voltage of multijunction solar cells according to schemes 1-2, the monocrystalline germanium wafer has a thickness of 100-700 μm, preferably 100-500 μm, more preferably 100-200 μm and even more preferably 120-140 μm.

Scheme 4: The present invention also provides a method for preparing a monocrystalline germanium wafer that increases the open-circuit voltage of multijunction solar cells, comprising
1) cutting an initial monocrystalline germanium wafer from a monocrystalline germanium ingot containing silicon and gallium, wherein the initial monocrystalline germanium wafer obtained has a silicon atomic concentration of from $1\times10^{14}$ atoms/cc to $10\times10^{18}$ atoms/cc, a gallium atomic concentration of from $1\times10^{16}$ atoms/cc to $10\times10^{19}$ atoms/cc, and a thickness of 200-800 μm;
preferably, the initial monocrystalline germanium wafer obtained has a silicon atomic concentration of from $2\times10^{14}$ atoms/cc to $8\times10^{18}$ atoms/cc, and a gallium atomic concentration of from $2\times10^{16}$ atoms/cc to $9\times10^{19}$ atoms/cc;
and more preferably, the initial monocrystalline germanium wafer obtained has a silicon atomic concentration of from $3\times10^{14}$ atoms/cc to $7\times10^{18}$ atoms/cc, and a gallium atomic concentration of from $2\times10^{16}$ atoms/cc to $8\times10^{19}$ atoms/cc;
2) edge grinding the initial monocrystalline germanium wafer obtained in step 1);
3) subjecting the initial monocrystalline germanium wafer edge grinding in step 2) to surface treatment; and
4) subjecting the initial monocrystalline germanium wafer surface-treated in step 3) to rough polishing and then to finish polishing to obtain a monocrystalline germanium wafer product, wherein the resulting monocrystalline germanium wafer product has a thickness of 100-700 μm.

Scheme 5: The method for preparing a monocrystalline germanium wafer that increases open-circuit voltage of multijunction solar cells according to the present invention, wherein the ratio of atomic concentration of silicon to an atomic concentration of gallium is 1:10-20, preferably 1:8-19 and more preferably 1:6-18.

Scheme 6: The method for preparing a monocrystalline germanium wafer that increases the open-circuit voltage of multijunction solar cells according to the present invention, wherein the monocrystalline germanium wafer has a thickness of 100-700 μm, preferably 100-500 μm, more preferably 100-200 μm and even more preferably 120-140 μm.

Scheme 7: A method for preparing a monocrystalline germanium ingot that increases the open-circuit voltage of multijunction solar cells, comprising 1) loading first raw germanium material, co-dopants silicon and gallium, and optionally a liquid sealer into a crucible that includes a seed well holding a seed crystal;
2) loading second raw germanium material into a loading container for supplementing the first raw germanium material, wherein the loading container is optionally loaded with a liquid sealer;
3) placing the crucible described in step 1) and the loading container described in step 2) in a quartz tube and sealing the quartz tube under vacuum;
4) placing the quartz tube with the crucible and the loading vessel described in step 3) into a crystal growth furnace having a movable quartz tube support that supports said quartz tube;
5) melting the first raw germanium material to create a first melt, melting the second raw germanium material to create a second melt and then adding all the melted second raw Ge material in the container into the crucible;
6) cooling the melt in the crucible obtained in step 5) and controlling the temperature gradient and cooling rate of the melt so that the melt crystallizes when in contact with the seed crystal and forms a monocrystalline germanium ingot; and
7) cooling the monocrystalline germanium ingot;

wherein the co-dopants silicon and gallium added in step 1) are in such amounts that within an effective length of the resulting monocrystalline germanium ingot, silicon has an atomic concentration of from $1\times10^{14}$ atoms/cc to $10\times10^{18}$ atoms/cc, and gallium has an atomic concentration of from $1\times10^{16}$ atoms/cc to $10\times10^{19}$ atoms/cc;

preferably, silicon has an atomic concentration of from $2\times10^{14}$ atoms/cc to $8\times10^{18}$ atoms/cc, and gallium has an atomic concentration of from $2\times10^{16}$ atoms/cc to $9\times10^{19}$ atoms/cc; and more preferably, silicon has an atomic concentration of from $3\times10^{14}$ atoms/cc to $7\times10^{18}$ atoms/cc, and gallium has an atomic concentration of from $2\times10^{16}$ atoms/cc to $8\times10^{19}$ atoms/cc.

Scheme 8: The method for preparing a monocrystalline germanium ingot that increases the open-circuit voltage of multijunction solar cells according to the present invention, the ratio of an atomic concentration of silicon to that of gallium is 1:10-20, preferably 1:8-19, and more preferably 1:6-18.

Scheme 9: The method for preparing a monocrystalline germanium ingot that increases the open-circuit voltage of multijunction solar cells according to any of schemes 7-8, wherein the monocrystalline germanium ingot is a crystal ingot having a circular cross-section with a diameter of 10 inches or less.

Scheme 10: The method for preparing a monocrystalline germanium ingot that increases open-circuit voltage of multiple solar cells according to any of schemes 7-9, wherein when the melt crystallizes when in contact with the seed crystal and forms a monocrystalline germanium ingot in step 6), a temperature gradient of 0.3 to 2.5° C./cm is created in an ingot growth zone; preferably, a temperature gradient of 0.5 to 2.0° C./cm is created in an ingot growth zone; and more preferably a temperature gradient of 1.0 to 1.5° C./cm is created in an ingot growth zone.

Scheme 11: The method for preparing a monocrystalline germanium ingot that increases the open-circuit voltage of multijunction solar cells according to any of schemes 7-10, wherein when the melt crystallizes when in contact with the seed crystal and forms a monocrystalline germanium ingot in step 6), a temperature gradient of 0.2 to 1.5° C./cm is created at a seed crystal end; preferably a temperature gradient of 0.2 to 1.0° C./cm is created at a seed crystal end; and more preferably a temperature gradient of 0.2 to 0.5° C./cm is created at a seed crystal end.

Scheme 12: The method for preparing a monocrystalline germanium ingot that increases the open-circuit voltage of multijunction solar cells according to any of schemes 7-11, the head wafer of the resulting monocrystalline germanium ingot has an average dislocation density of less than $80/cm^2$ and the tail wafer of the resulting monocrystalline germanium ingot has an average dislocation density of less than $75/cm^2$.

Scheme 13: Use of the monocrystalline germanium wafer that increases the open-circuit voltage of multijunction solar cells according to any of schemes 1-3, a monocrystalline germanium wafer prepared by the method for preparing a monocrystalline germanium wafer that increases the open-circuit voltage of multijunction solar cells according to any of schemes 4-6, and a monocrystalline germanium wafer sliced from the monocrystalline germanium ingot prepared by the method for preparing a monocrystalline germanium ingot that increases the open-circuit voltage of multijunction solar cells according to any of schemes 7-12 for increasing the open-circuit voltage of solar cells.

EXAMPLES

The invention is described with reference to a complete example. The examples described herein are not intended to represent all examples encompassed by the invention, but rather merely to exemplify one embodiment. The invention may include many other embodiments.

Raw Materials and Equipment

High purity germanium, in the shape of chunks, with a purity of 99.999%.

Boron trioxide, an analytical reagent.

Figure 11:
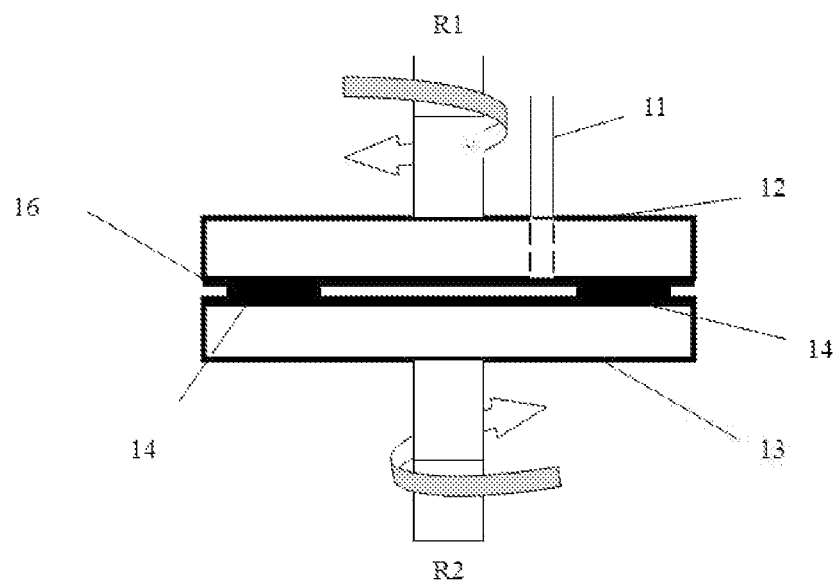
FIG. 11 is an example of an apparatus for carrying out the grinding and polishing steps in the method for preparing the wafer of the present invention.

A polishing machine (the diameter of the upper and lower discs being 1.0 m), shown in FIG. 11, where R1 and R2 are the rotary axis, 11 is a grinding liquid or polishing liquid tube, 12 is an upper disc of the equipment, 13 is a lower disc of the equipment, 14 is a wafer and a support pad and 16 is a grinding pad or a polishing pad. The grinding pad is a polyester grinding pad, the rough polishing pad is a polyurethane polishing pad and the finish polishing pad is a polyurethane polishing pad. The lower disc also contains polishing pads and polishing pads, which are the same as those in the upper discs, are located under the wafer and the support pad, and are not shown. The support pad (the same pad for grinding and polishing), the grinding pad and polishing pad have a diameter of 1 m; 4 holes of the support pad for supporting the wafer are located at the center in the radial direction and evenly distributed in the circumferential direction.

Grinding liquid which is a mixture of Fujimi 20T aluminum oxide grinding powder and water with a weight ratio of 1:1, wherein the flow rate of the grinding fluid during the grinding process is 90 ml/m² equipment disc areas/min (based on one side).
A multi-wire cutting machine.
Silicon carbide, with a particle size of 10 microns.
Mineral oil, C10 oil.
Multimeter, with a voltage range of from 0.1 mV to 1,000 V.
A multifunction digital four-probe tester.
A high-resolution secondary ion mass spectrometer.

Performance Test

The testing conditions for the prepared initial monocrystalline germanium wafers are as follows: qualified wafers are those that are ascertained to be intact and have no cracks on the surface by visual inspection.

Resistivity is measured by the method described in the GB/T 26074-2010 *Monocrystalline Germanium Crystal Resistivity Direct Current Four-Probe Measurement Method*" using the above-mentioned multi-function digital four-probe tester.

Dislocation density is measured by the method described in GB/T5252-2006 *Germanium Single Dislocation Etch Pit Density Measurement Methods*.

Open-circuit voltage is measured using the multimeter.

The contents of the dopants, silicon and germanium, are determined using the aforementioned high-resolution secondary ion mass spectrometer under the following conditions: the average atomic concentration of Si is determined by sputtering a cesium ion (Cs+) beam as an incident ion beam from the surface of the sample to 10 micrometers inside the sample. The average atomic concentration of Ga is determined by sputtering an oxygen ion (O−) beam as an incident ion beam from the surface of the sample to 10 micrometers inside the sample. The vacuum of a testing chamber IS at $10^{-7}$ Torr, the intensity of the incident ion beam is 0.16 mA/cm², the analysis area is 250×250 square microns and the sputtering rate is 3.6 µm/h.

Preparation of Monocrystalline Germanium Ingots

In the following examples, monocrystalline germanium ingots with a diameter of 4 inches that increase the open-circuit voltage of multijunction solar cell were prepared. Nevertheless, monocrystalline germanium ingots having a diameter of, for example, 1 to 8 inches or larger can also be prepared by the method for preparing a monocrystalline germanium ingot according to the present invention.

Example 1

10 kg high-purity bulk raw germanium material, 0.5 g gallium as a dopant (50 ppm based on the high-purity raw germanium material) and boron trioxide as a liquid sealant were used.
1) loading 65% of the above-mentioned amounts of the high-purity bulk raw germanium material, gallium and boron trioxide respectively into a first growth crucible that includes a seed well holding a seed crystal;
2) loading the remaining 35% of the high-purity bulk raw germanium material, gallium and boron trioxide into a second feeding crucible located above the first growth crucible;
3) placing the first growth crucible and the second feeding crucible in a quartz tube and sealing the quartz tube under vacuum of $10^{-5}$ Torr;
4) placing the quartz tube with the first growth crucible and the second feeding crucible described in step 3) into a crystal growth furnace having a movable quartz tube support that supports said quartz tube;
5) starting the heating procedure of the growth furnace and heating the first growth crucible and the second feeding crucible at a heating rate of 20° C./min so as to melt the first raw germanium material to create a first melt and melt the second raw germanium material to create a second melt, and then adding the second melt into the first melt;
6) cooling the melt obtained in step 5) and controlling the cooling rate of the melt so that the melt crystallizes when in contact with the seed crystal and forms a monocrystalline germanium ingot, wherein the temperature gradient of the germanium single crystal growth is 3.5° C./cm; and the temperature gradient of the germanium single crystal growth staring from the crystal seed end is 1° C./cm; and
7) cooling the monocrystalline germanium ingot at a cooling rate of 30° C./h.

Example 2

10 kg high-purity bulk raw germanium material, 0.5 g gallium as a dopant (50 ppm based on the high-purity raw germanium material), 0.01 g silicon as a dopant (1 ppm based on the high-purity raw germanium material) and boron trioxide as a liquid sealant were used.
1) loading 65% of the above-mentioned amounts of the high-purity bulk raw germanium material, gallium, silicon and boron trioxide respectively into a first growth crucible that includes a seed well holding a seed crystal;
2) loading the remaining 35% of the high-purity bulk raw germanium material, gallium, silicon and boron trioxide into a second feeding crucible located above the first growth crucible;
3) placing the first growth crucible and the second feeding crucible in a quartz tube and sealing the quartz tube under vacuum of $10^{-5}$ Torr;
4) placing the quartz tube with the first growth crucible and the second feeding crucible described in step 3) into a crystal growth furnace having a movable quartz tube support that supports said quartz tube;
5) starting the heating procedure of the growth furnace and heating the first growth crucible and the second feeding crucible at a heating rate of 20° C./min so as to melt the first raw germanium material to create a first melt and melt the second raw germanium material to create a second melt, and then adding all the second melt into the first melt;
6) cooling the melt obtained in step 5) and controlling the cooling rate of the melt so that the melt crystallizes when in contact with the seed crystal and forms a monocrystalline germanium ingot, wherein the temperature gradient of the germanium single crystal growth is 1.5° C./cm; and the temperature gradient of the germanium single crystal growth staring from the crystal seed end is 0.3° C./cm; and
7) cooling the monocrystalline germanium ingot at a cooling rate of 30° C./h.

TABLE 2

Properties of each of the monocrystalline germanium ingots prepared in the above examples

| | Effective length of the ingot | Resistivity of the ingot head | Resistivity of the ingot tail | Dislocation density of the ingot head | Dislocation density of the ingot tail | Content of gallium in the ingot (atoms/cc) | Content of silicon in the ingot (atoms/cc) |
|---|---|---|---|---|---|---|---|
| Example 1 | 191 mm | 0.05Ω · cm | 0.01Ω · cm | 81/cm$^2$ | 106/cm$^2$ | $2.5 \times 10^{16} \sim 2 \times 10^{19}$ | 0 |
| Example 2 | 193 mm | 0.015Ω · cm | 0.003Ω · cm | 65/cm$^2$ | 61/cm$^2$ | $2.5 \times 10^{16} \sim 2 \times 10^{19}$ | $5 \times 10^{14} \sim 6 \times 10^{18}$ |

The monocrystalline germanium ingot prepared in Example 1 has a length of 191 mm, and almost all of the raw materials loaded have grown into the monocrystalline ingot.

The monocrystalline germanium ingot prepared in Example 2 has a length of 193 mm, and almost all of the raw materials loaded have grown into the monocrystalline ingot.

Preparation of Monocrystalline Germanium Wafers

The monocrystalline germanium ingots that increase the open-circuit voltage of the multijunction solar cell prepared in the above examples 1-2 are cut into monocrystalline germanium wafers according to the following steps.

Cutting: The monocrystalline germanium ingot is cut into initial monocrystalline germanium wafers having a thickness of 240 μm using a multi-wire cutting machine. During cutting, a semi-enclosed graphite is used to secure the circular monocrystalline germanium ingot. After the cutting is finished, the initial monocrystalline germanium wafers are manually removed and the operation is performed by the same person under the same condition.

Chamfering: The edge of each circular wafer is chamfered using a chamfering machine such that the cross-section of the edge is in an arc shape.

Fixing: One side of the wafer is glue onto a circular flat ceramic plate (Ra<0.5 μm) with a diameter of 10.2 cm and a thickness of 250 μm. Pressure is gently applied to ensure that there is no air bubble between the wafer and the ceramic plate.

Surface Treatment: The wafer-bearing ceramic plate is placed in an etching liquid at 35° C. for 12 seconds. The etching liquid comprises 1 mol % NH$_3$, 10 mol % hydrogen peroxide and the balance water.

Polishing: The wafer-bearing ceramic plate is then placed in the support pad of the polishing machine (against the ceramic plate), and rough polishing solution shown in Table 3 is first used in the polishing machine for 60 minutes under the rough polishing conditions shown in Table 3. After washing with deionized water (with a resistivity greater than 17.5 megaohm·cm at 25° C.) and wafer drying, the polishing machine is loaded with the finish polishing solution shown in Table 3 to carry out polishing for 6 minutes under the finish polishing condition shown in Table 4. The wafer-bearing ceramic wafer is then taken out and placed on a heating furnace to melt the glue. The wafer is removed from the ceramic plate, rinsed with deionized water and then dried.

Washing: a) The wafer is immersed in an aqueous solution containing 0.3% by weight of NH$_3$ and 1.3% by weight (if not stated otherwise, the amount of each of the following solutions is in weight percentages based on the total weight of the solution) of hydrogen peroxide at 10° C. for 5 minutes; b) the surface of the wafer is rinsed with deionized water at 10° C. for 3 minutes; c) the wafer is dipped in a 10 wt % hydrogen peroxide solution at 20° C. for 5 minutes; d) the wafer surface is rinsed with deionized water at 15° C. for 3 minutes; e) the wafer is immersed in a 10% by weight aqueous ammonia for 5 minutes at 20° C.; f) the surface of the wafer is rinsed with deionized water for 3 minutes at 15° C.; and g) the wafer is placed in a rotary wafer drier and is dried with hot nitrogen.

The resulting monocrystalline germanium wafer had a thickness of 140 μm.

TABLE 3

Composition of the rough polishing solution and the polishing conditions

| | | |
|---|---|---|
| Chemical composition (weight %, based on the total weight of the chemical materials) | Sodium dichloroisocyanurate | 15.89 |
| | Sodium pyrophosphate | 13.38 |
| | Dicarbonate | 9.07 |
| | Sodium benzenesulfonate | 0.14 |
| | Silica sol | 64.06 |
| | Total concentration of the chemical materials | 2.60 |
| Balance (weight %) | Water | 97.40 |
| Polishing conditions | Pressure per wafer unit area, g/cm$^2$ | 63.75 |
| | Flow rate of polishing fluid, l/cm$^2$ wafer/h | 83.75 |
| | Rotating speed (rpm) Upper disc | 22.50 |
| | Rotating speed (rpm) Lower disc | 11.00 |

TABLE 4

Composition of the finish polishing solution and the polishing conditions

| | | |
|---|---|---|
| Chemical composition (weight %, based on the total weight of the chemical materials) | Sodium dichloroisocyanurate | 33.95 |
| | Acid sodium pyrophosphate | 26.65 |
| | Sodium carbonate | 19.33 |
| | Dicarbonate | 20.25 |
| | Sodium benzenesulfonate | 0.36 |
| | Total concentration of the chemical materials | 1.23 |
| Balance (weight %) | Water | 98.77 |
| Polishing conditions | Pressure per wafer unit area, g/cm$^2$ | 58.75 |
| | Flow rate of polishing fluid, l/cm$^2$ wafer/h | 0.55 |
| | Rotating speed (rpm) Upper disc | 37.50 |
| | Rotating speed (rpm) Lower disc | 22 |

Preparation of Solar Cells

Solar cells are prepared using the monocrystalline germanium substrates cut from the monocrystalline germanium ingots prepared in the examples as per the following steps. 1) The obtained monocrystalline germanium substrate is placed in an epitaxial furnace, and an epitaxial layer of a multijunction solar cell is grown by a metal organic chemical vapor epitaxy method. The gas sources and organic metal sources used in the epitaxial process include high-purity hydrogen, $PH_3$ (phosphine), $AsH_3$ (arsine), TM-Ga (tri-methyl gallium) and TM-In (tri-methyl indium), and n-type doping is done with phosphorus to form a PN junction with the p-type germanium substrate;
2) A middle InGaAs cell layer is epitaxially grown;
3) A top InGaAs cell layer is epitaxially grown;
4) Electrodes are formed: the front and back of the solar cell is coated with a gold, germanium and nickel layer by the electron beam evaporation process to form positive and negative electrode leads; and
5) The cells are tested: The completed cells are classified into subcategories through tests.

The open-circuit voltage of each solar cell is measured with a multimeter.

Figure 6:
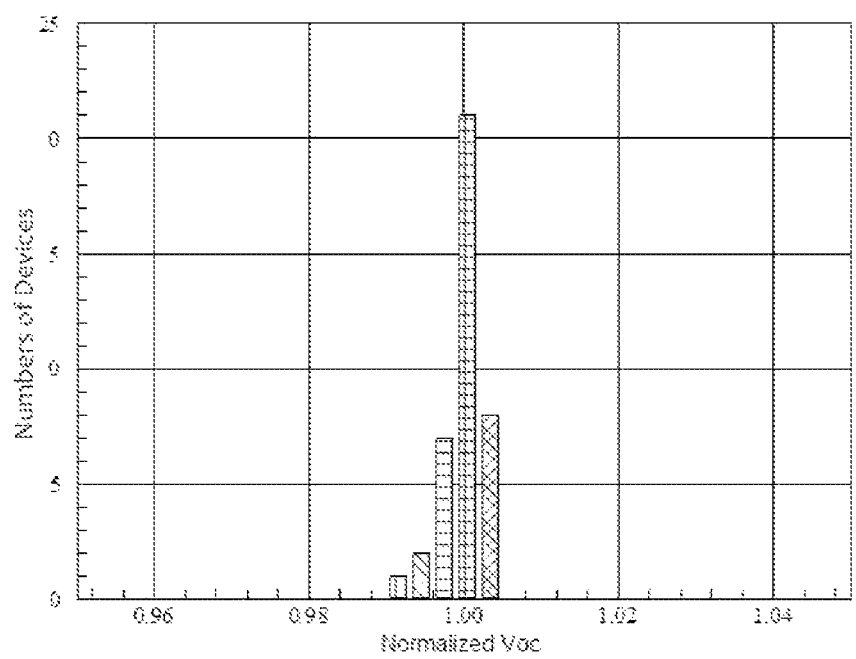
FIG. 6 is a normalized profile of the key performance indicator—open-circuit voltage—of multijunction solar cells prepared based on a non-inventive, monocrystalline germanium substrate.

In Example 1, the monocrystalline germanium ingot is prepared by a standard melt growth process. The open circuit voltage of the multijunction solar cell prepared based on the monocrystalline germanium ingot is shown in FIG. 6.

Figure 7:
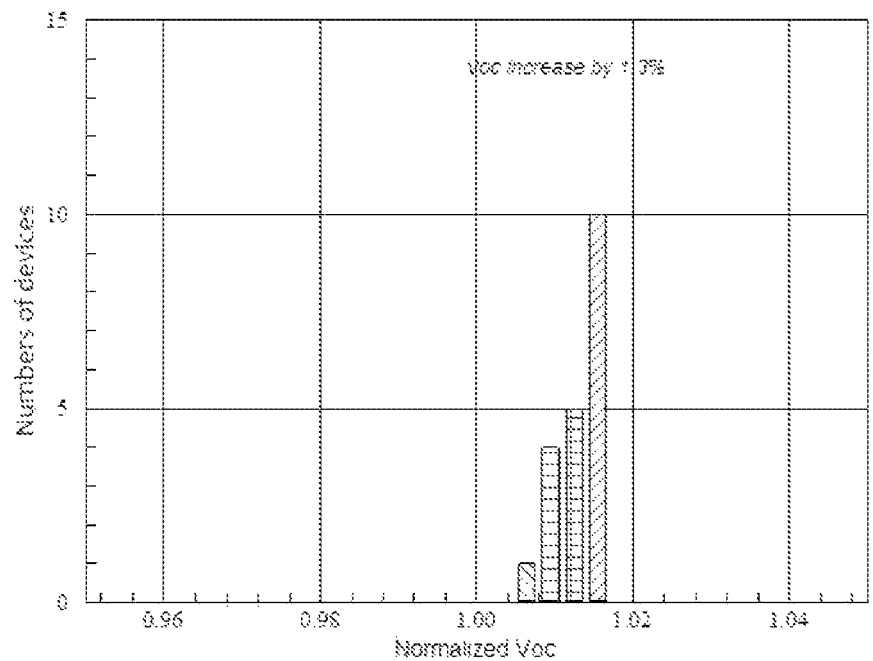
FIG. 7 is a normalized profile of the open-circuit voltage of multijunction solar cells prepared from a monocrystalline germanium substrate grown by using the co-doping method of the present invention.
Figure 8:
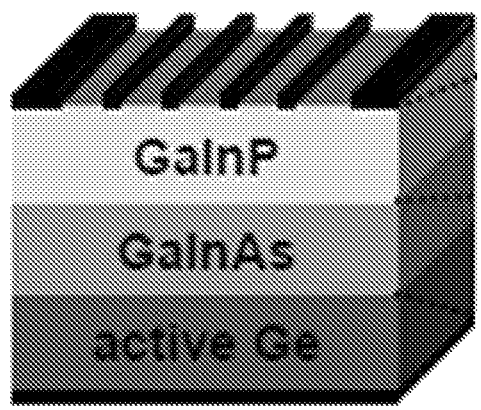
FIG. 8 is a schematic diagram of a triple-junction solar cell on a germanium substrate.

In Example 2, an appropriate amount of silicon dopant is added during loading of the raw germanium material into the crucible and a suitable growth procedure is adopted at the same time. Almost all of the raw materials loaded are grown into monocrystalline material, and almost the entire ingot can be used for preparation of the substrate material used for the epitaxial growth of photovoltaic devices. Silicon atoms are detected in these ingots. The monocrystalline germanium substrate material prepared with these ingots significantly increases the open-circuit voltage of the photovoltaic devices epitaxially grown thereon, as shown in FIG. 7. The results show that when the dopant content in the final ingot reaches $\sim 4 \times 10^{18}$ atoms/cc, the open-circuit voltage Voc of the multijunction solar cell epitaxially grown on the substrate prepared from these ingots increased by 1.3%, that significantly increased the light-to-electricity conversion efficiency of the multijunction solar cell.

Meanwhile, the dopants will further significantly improve the electrical properties of the substrate, making the resistivity of the ingot more uniform.

It should be noted that any germanium crystal substrate (such as crystal ingot, wafer and the like) made using the methods/processes disclosed herein is explicitly within the scope of the present invention. In addition, any product (such as an electronic device or a photoelectric device) containing such a germanium crystal substrate prepared by one of the methods of the present invention is also in accordance with the present invention.

Although in the foregoing, the present invention has been described with reference to specific embodiments thereof, it will be understood by those skilled in the art that various changes may be made to the embodiments described without departing from the spirit and scope of the invention, and the appended claims define the scope of the present inventions.

The invention claimed is:

1. A monocrystalline germanium wafer that increases open-circuit voltage of a bottom cell of multijunction solar cells, wherein the monocrystalline germanium wafer comprises co-dopants silicon and gallium, with silicon having an atomic concentration of from $1 \times 10^{14}$ atoms/cc to $1 \times 10^{19}$ atoms/cc and gallium having an atomic concentration of from $1 \times 10^{16}$ atoms/cc to $1 \times 10^{20}$ atoms/cc.

2. The monocrystalline germanium wafer according to claim 1, wherein silicon has an atomic concentration of from $2 \times 10^{14}$ atoms/cc to $8 \times 10^{18}$ atoms/cc, and gallium has an atomic concentration of from $2 \times 10^{16}$ atoms/cc to $9 \times 10^{19}$ atoms/cc.

3. The monocrystalline germanium wafer according to claim 1, wherein silicon has an atomic concentration of from $3 \times 10^{14}$ atoms/cc to $7 \times 10^{18}$ atoms/cc, and gallium has an atomic concentration of from $2 \times 10^{16}$ atoms/cc to $8 \times 10^{19}$ atoms/cc.

4. The monocrystalline germanium wafer according to claim 1, wherein the ratio of atomic concentration of silicon to atomic concentration of gallium is 1:10-20.

5. The monocrystalline germanium wafer according to claim 1, wherein the ratio of atomic concentration of silicon to atomic concentration of gallium is 1:8-19.

6. The monocrystalline germanium wafer according to claim 1, wherein the ratio of atomic concentration of silicon to atomic concentration of gallium is 1:6-18.

7. The monocrystalline germanium wafer according to claim 1, wherein the monocrystalline germanium wafer has a thickness of 100-700 μm.

8. The monocrystalline germanium wafer according to claim 1, wherein the monocrystalline germanium wafer has a thickness of 100-500 μm.

9. The monocrystalline germanium wafer according to claim 1, wherein the monocrystalline germanium wafer has a thickness of 100-200 μm.

10. The monocrystalline germanium wafer according to claim 1, wherein the monocrystalline germanium wafer has a thickness of 120-140 μm.

11. A method for preparing a monocrystalline germanium wafer that increases open-circuit voltage of multijunction solar cells, comprising
1) cutting an initial monocrystalline germanium wafer from a monocrystalline germanium ingot containing silicon and gallium, wherein the initial monocrystalline germanium wafer obtained by cutting has a silicon atomic concentration of from $1 \times 10^{14}$ atoms/cc to $10 \times 10^{18}$ atoms/cc, a gallium atomic concentration of from $1 \times 10^{16}$ atoms/cc to $10 \times 10^{19}$ atoms/cc, and a thickness of 200-800 μm;
2) edging the initial monocrystalline germanium wafer obtained in step 1);
3) subjecting the initial monocrystalline germanium wafer edged in step 2) to surface treatment; and
4) subjecting the initial monocrystalline germanium wafer surface-treated in step 3) to rough polishing and then to finish polishing to obtain a monocrystalline germanium wafer product, wherein the resulting monocrystalline germanium wafer product has a thickness of 100-700 μm.

12. The method for preparing a monocrystalline germanium wafer according to claim 11, wherein the ratio of atomic concentration of silicon to atomic concentration of gallium is 1:10-20.

13. The method for preparing a monocrystalline germanium wafer according to claim 11, wherein the monocrystalline germanium wafer has a thickness of 100-700 μm.

14. A method for preparing a monocrystalline germanium ingot that increases open-circuit voltage of multijunction solar cells, comprising
1) loading a first raw germanium material, co-dopants silicon and gallium, and optionally a liquid sealer into a crucible comprising a seed well holding a seed crystal;
2) loading a second raw germanium material into a loading container for supplementing the first raw germanium material,
3) placing the crucible described in step 1) and the loading container described in step 2) in a quartz tube and sealing the quartz tube under vacuum;

4) placing the quartz tube with the crucible and the loading container described in step 3) into a crystal growth furnace having a movable quartz tube support that supports said quartz tube;

5) melting the first raw germanium material to create a first melt, melting the second raw germanium material to create a second melt and then adding all of the melted second raw germanium material in the loading container into the crucible;

6) cooling the melt in the crucible obtained in step 5) and controlling a temperature gradient and cooling rate of the melt so that the melt crystallizes when in contact with the seed crystal and forms a monocrystalline germanium ingot; and 7) cooling the monocrystalline germanium ingot;

wherein the co-dopants silicon and gallium added in step 1) are in such amounts that within an effective length of the resulting monocrystalline germanium ingot, silicon has an atomic concentration of from $1\times10^{14}$ atoms/cc to $1\times10^{19}$ atoms/cc, and gallium has an atomic concentration of from $1\times10^{16}$ atoms/cc to $1\times10^{20}$ atoms/cc.

15. The method for preparing a monocrystalline germanium ingot according to claim 14, wherein the ratio of atomic concentration of silicon to atomic concentration of gallium is 1:10-20.

16. The method for preparing a monocrystalline germanium ingot according to claim 14, wherein when the melt crystallizes when in contact with the seed crystal and forms a monocrystalline germanium ingot in step 6), a temperature gradient of 0.3 to 2.5° C./cm is created in an ingot growth zone.

17. The method for preparing a monocrystalline germanium ingot according to claim 14, wherein when the melt crystallizes when in contact with the seed crystal and forms a monocrystalline germanium ingot in step 6), a temperature gradient of 0.5 to 2.0° C./cm is created in an ingot growth zone.

18. The method for preparing a monocrystalline germanium ingot according to claim 14, wherein when the melt crystallizes when in contact with the seed crystal and forms a monocrystalline germanium ingot in step 6), a temperature gradient of 1.0 to 1.5° C./cm is created in an ingot growth zone.

* * * * *